United States Patent [19]
Tang

[11] Patent Number: 6,130,578

[45] Date of Patent: Oct. 10, 2000

[54] CHOPPER-STABILIZED AMPLIFIER WITH DIGITAL FREQUENCY MODULATED CLOCKING AND METHOD

[75] Inventor: Andrew T. K. Tang, Santa Clara, Calif.

[73] Assignee: Analog Devices, Inc., Norwood, Mass.

[21] Appl. No.: 09/295,484

[22] Filed: Apr. 20, 1999

[51] Int. Cl.[7] ....................................... H03F 1/02
[52] U.S. Cl. .................. 330/9; 330/51; 327/124
[58] Field of Search ................... 330/9, 51, 149; 327/124

[56] References Cited

U.S. PATENT DOCUMENTS

| | | | |
|---|---|---|---|
| 4,138,649 | 2/1979 | Schaffer | 330/9 |
| 4,931,745 | 6/1990 | Goff et al. | 330/9 |
| 4,939,516 | 7/1990 | Early | 341/143 |
| 5,115,202 | 5/1992 | Brown | 330/9 |
| 5,486,788 | 1/1996 | Schlager et al. | 330/9 |
| 5,926,066 | 7/1999 | Sauer | 330/9 |

OTHER PUBLICATIONS

Paul Horowitz and Winfield Hill, "Precision Circuits and Low–Noise Techniques", *The Art Of Electronics*, Second Edition, Chapter 7, pp. 416–417 (1989).

*Primary Examiner*—Robert Pascal
*Assistant Examiner*—Henry Choe
*Attorney, Agent, or Firm*—Koppel & Jacobs

[57] ABSTRACT

The chopping frequency driving a chopper-stabilized amplifier (CSA) is dynamically varied between an upper and lower frequency limit to reduce the intermodulation distortion, clock noise and low-frequency noise found in prior art designs. The upper limit is set to accommodate the settling times required by the CSA's memory capacitors, and the lower limit is set to a non-zero frequency significantly greater than DC to reduce low frequency noise. The two limits permit IMD and clock noise to be widely scattered and enable a near optimum trade off between IMD and chopping noise on one hand, and low frequency noise on the other. The chopping frequency is preferably generated digitally with a loadable counter which divides down a fixed frequency master clock, with the binary value presented at the counter's load inputs periodically varied to dynamically vary the division ratio and thus frequency modulate the chopping frequency. The binary value presented to the load inputs are generated with a second counter or a PRBS, for example, which establish the upper and lower frequency limits.

21 Claims, 4 Drawing Sheets

CHOPPER-STABILIZED AMPLIFIER WITH DIGITAL FREQUENCY MODULATED CLOCKING AND METHOD

BACKGROUND OF THE INVENTION

1. Field of the Invention

This invention relates to the field of chopper-stabilized amplifiers, particularly high bandwidth, low noise chopper-stabilized amplifiers.

2. Description of the Related Art

Chopper-stabilized operational amplifiers (CSAs) are well known and widely used due to their low input offset voltages. A schematic diagram of a basic CSA 5 is shown in FIG. 1a. The CSA receives a differential input signal at terminals 10 and 12, which are connected to the non-inverting and inverting terminals, respectively, of a main operational amplifier A1. A "memory" capacitor C1 is connected to A1's null terminal N1, and A1's output is the output of the CSA. An auxiliary operational amplifier A2 has its non-inverting input connected to differential input terminal 10 through a switch S1, and to its inverting terminal through a switch S2. A2's inverting terminal is also connected to differential input terminal 12. A memory capacitor C2 is connected to A2's null terminal N2. A switch S3 is connected between A2's output and C2, and a switch S4 is connected between A2's output and A1's null terminal N1.

A clock circuit 14 produces two outputs 16 and 18 which are the inverse of each other, and which oscillate between two phases $\phi1$ and $\phi2$. A timing diagram of clock outputs 16 and 18 is shown in FIG. 1b. Clock output 16 controls switches S1 and S4, opening them during $\phi1$ and closing them during $\phi2$. Clock output 18 controls switches S2 and S3, closing them during $\phi1$ and opening them during $\phi2$. Clock outputs 16 and 18 are the CSA's "chopping signals" and the frequency at which they oscillate is the CSA's "chopping frequency".

The operation of the CSA is as follows: during $\phi1$, switch S2 closes and shorts the inputs of auxiliary amplifier A2 together. Switch S3 is also closed, connecting A2's output to its nulling input N2, thus nulling A2. The voltage on N2 is stored on memory capacitor C2. The differential input signal is amplified by A1 alone during $\phi1$.

During $\phi2$, S2 opens and S1 closes, connecting A2's inputs across differential input terminals 10 and 12. Switch S3 also opens, but A2 continues to be nulled by the voltage stored on C2. Switch S4 closes, connecting A2's output to A1's null input N1. Now a differential input to the CSA is amplified by A2 followed by A1 through N1. When the gain of A2 is large, the CSA's input offset voltage is largely determined by A2, and because A2 was nulled during $\phi1$, the CSAs has a very low input offset voltage. Memory capacitor C1 connected to A1's nulling input N1 allows A1 to continue to be nulled during $\phi1$.

Chopper-stabilized amplifiers have several drawbacks, however, as are discussed, for example, in Horowitz and Hill, *The Art of Electronics*, Cambridge University Press (1989), pp. 416–417. One of the most serious is a clock-induced "input-referred" noise caused by charge coupling from the switches, typically MOSFETs, causing spikes to appear in the CSA's output at the chopping frequency $f_c$. Intermodulation distortion (IMD) is also present in the output due to the differences in the CSA's gain between $\phi1$ and $\phi2$. The gain bandwidths during $\phi1$ and $\phi2$ are typically made as equal as possible to minimize IMD. Some mismatch is inevitable, however, and IMD is present as a consequence.

The usual approach to reduce input-referred noise and IMD is found in U.S. Pat. No. 4,931,745 to Goff et al. Here, the chopping frequency $f_c$ is made as high as can be accommodated by the settling time of memory capacitors C1 and C2, pushing noise and IMD to the highest frequency possible. However, a component of IMD exists at $f_c-f_s$, where $f_s$ is the frequency of the input signal. IMD and chopping noise can be filtered as long as they are outside the signal band, but the input signal bandwidth is practically limited to about $f_c/2$. Input signal frequency range can be extended by increasing $f_c$, but if the chopping frequency is too high, the memory capacitors cannot settle sufficiently and the offset voltage will shoot up. Another disadvantage of clocking the amplifier at a fixed frequency is that the IMD and chopping noise are concentrated into a fixed frequency band, reducing the amplifier's spurious free dynamic range.

An alternative approach was disclosed in U.S. Pat. No. 5,115,202 to Brown. A pseudo-random binary sequence generator (PRBS) acts as a clock circuit in order to reduce the power spectral density of the residual IMD and clock noise by dynamically randomizing the chopping rate. This scatters the IMD components and clock noise over a wide frequency range, reducing their power spectral density. However, the low frequency input-referred noise of the CSA is raised significantly with this technique. The amplitude of the low frequency noise is approximately inversely proportional to the square root of the chopping frequency. Brown's approach allows the instantaneous chopping frequency to approach DC, and thus significantly raise the noise floor.

SUMMARY OF THE INVENTION

A chopper-stabilized amplifier and operating method are presented which reduce the IMD and clock noise found in prior designs. The chopping frequency driving a chopper-stabilized amplifier is dynamically varied between defined upper and lower frequency limits. Controlling these two limits allows for a near optimum trade-off between IMD, chopping noise, and low frequency noise.

The chopping frequency's upper limit is preferably set as high as possible while still accommodating the settling times of the CSA's memory capacitors. The lower limit is set to a non-zero frequency significantly above DC: low enough to provide a wide frequency range over which IMD and chopping noise can be scattered, but not so low as to significantly increase low frequency noise. A lower frequency limit of between about 25% and 75% of the upper limit is preferred to provide a good balance between low frequency noise and IMD/clock noise.

The chopping frequency is preferably generated with a loadable counter which divides down a fixed frequency master clock. The binary value presented at the counter's load inputs is periodically varied to dynamically vary the division ratio and thus frequency modulate the chopping frequency. The binary value presented to the load inputs can be generated with a second counter or a PRBS, for example, and limiting the range of the load inputs establishes the upper and lower frequency limits of the chopping signal.

Further features and advantages of the invention will be apparent to those skilled in the art from the following detailed description, taken together with the accompanying drawings.

BRIEF DESCRIPTION OF THE DRAWINGS

FIG. 1b is a timing diagram for the prior art amplifier circuit in FIG. 1a.

DETAILED DESCRIPTION OF THE INVENTION

Figure 1B:
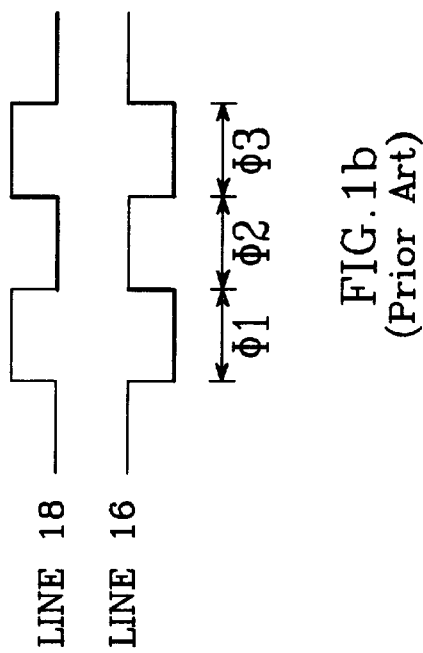
Figure 1A:
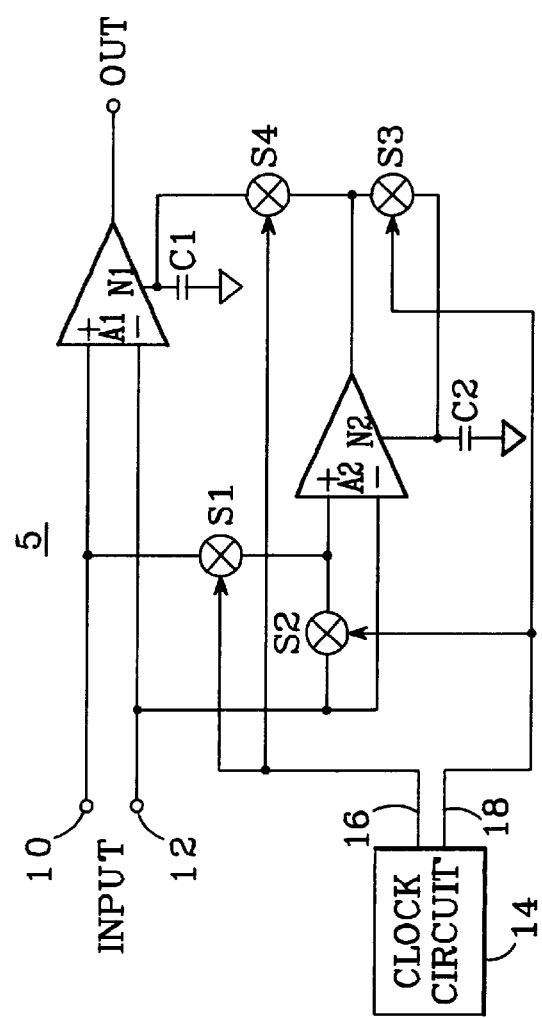
FIG. 1a is a schematic diagram of a prior art chopper-stabilized amplifier.
Figure 2:
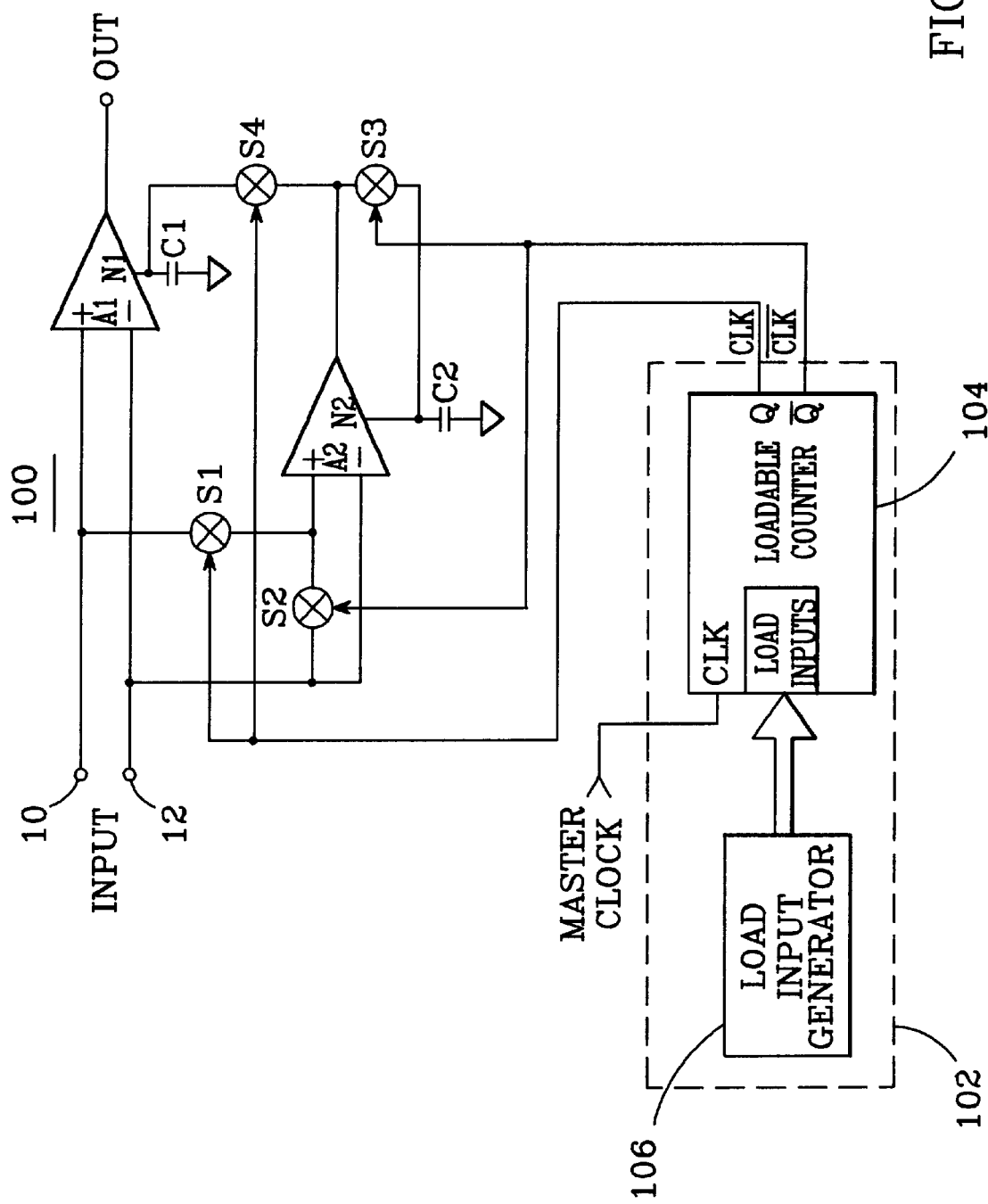
FIG. 2 is a schematic diagram of a chopper-stabilized amplifier per the present invention.

A chopper-stabilized amplifier driven with a chopping signal as described herein provides low IMD, with less chopping and low frequency noise coupled into the signal path than is found in prior art designs. A schematic diagram of a chopper-stabilized amplifier (CSA) 100 driven by a dynamically varying frequency modulated chopping frequency is shown in FIG. 2. Main amplifier A1, auxiliary amplifier A2, and switches S1–S4 are arranged in the same basic CSA configuration found in the prior art circuit of FIG. 1a. Now, however, switches S1–S4 are driven with a novel chopping frequency generating circuit 102.

The chopping frequency generating circuit 102 generates two complementary outputs CLK and $\overline{CLK}$, with CLK connected to switches S1 and S4, and $\overline{CLK}$ connected to switches S2 and S3. CLK and $\overline{CLK}$ oscillate at a chopping frequency $f_c$; because CLK and $\overline{CLK}$ control the CSA's switches, varying $f_c$ scatters the amplifier's IMD and clock noise over $f_c$'s frequency range.

The invention varies chopping frequency $f_c$ between an upper limit $f_{ch}$ and a lower limit $f_{cl}$, both of which are significantly above DC. Upper limit $f_{ch}$ is preferably made as high as possible while still accommodating the settling of the memory capacitors C1 and C2.

Two primary factors govern the selection of lower frequency limit $f_{cl}$: 1) low frequency noise; and 2) IMD and chopping noise. Making f1 lower widens the frequency spread between the upper and lower limits, which reduces the power spectral density of the IMD and chopping noise. However, as discussed above, the low frequency input-referred noise is significantly increased as $f_{cl}$ approaches zero because the amplitude of the low frequency noise is inversely proportional to the square root of the chopping frequency. To prevent the introduction of unacceptable levels of low frequency noise into the CSA's signal path, the invention requires that the lower limit $f_{cl}$ be a non-zero value that is significantly higher than DC. A value of $f_{cl}$ that is between about 25% and 75% of $f_{ch}$ provides a good balance between low frequency noise on one hand, and IMD and chopping noise on the other.

Thus, generating circuit 102 generates CLK and $\overline{CLK}$ signals that are frequency modulated between an upper limit and a non-zero lower limit; i.e., the frequency of the CLK and $\overline{CLK}$ signals is made to dynamically vary between an $f_{cl}$ that is significantly higher than DC and $f_{ch}$.

Figure 3:
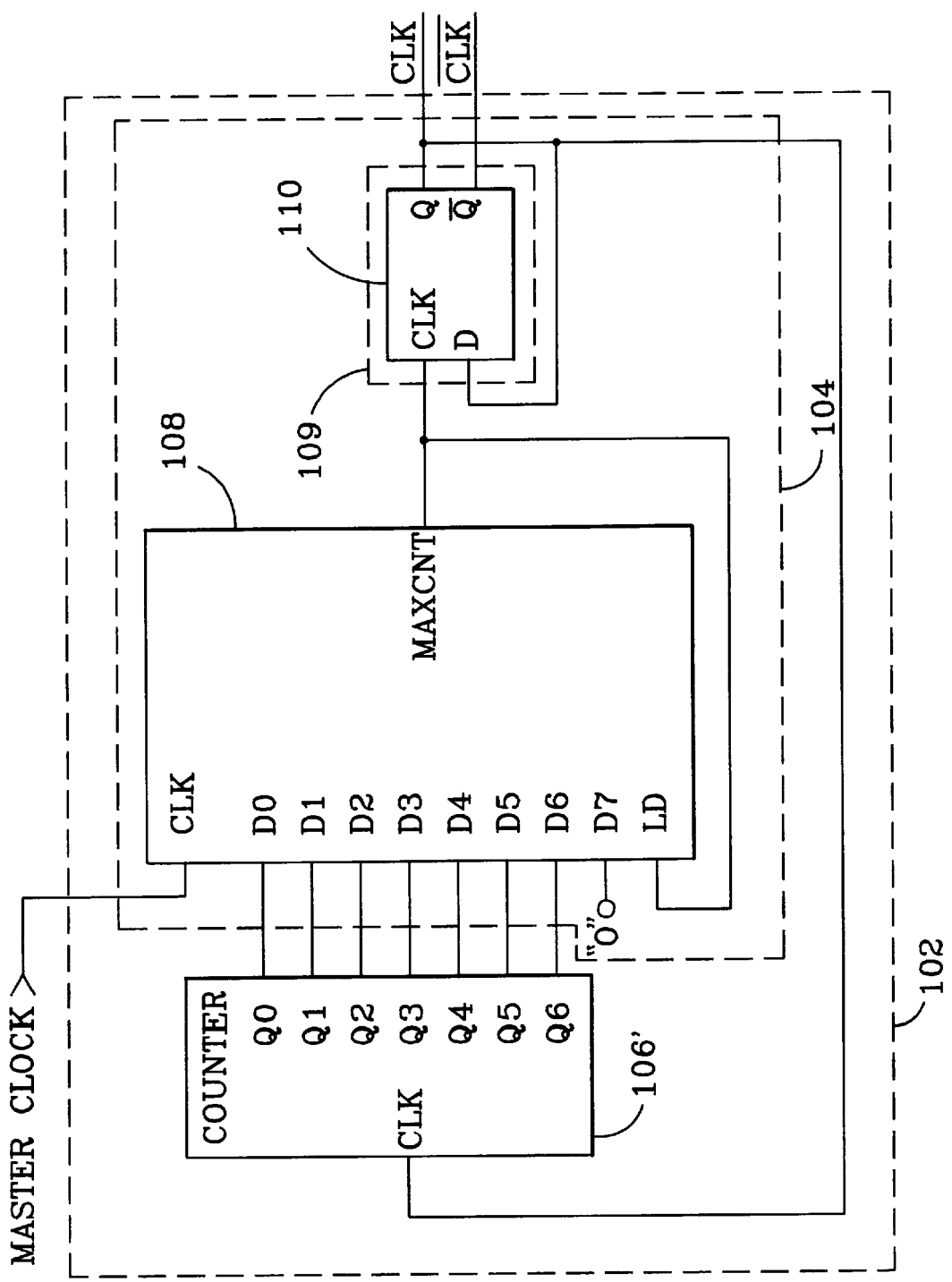
FIG. 3 is an embodiment of a chopping signal generating circuit per the present invention.
Figure 4:
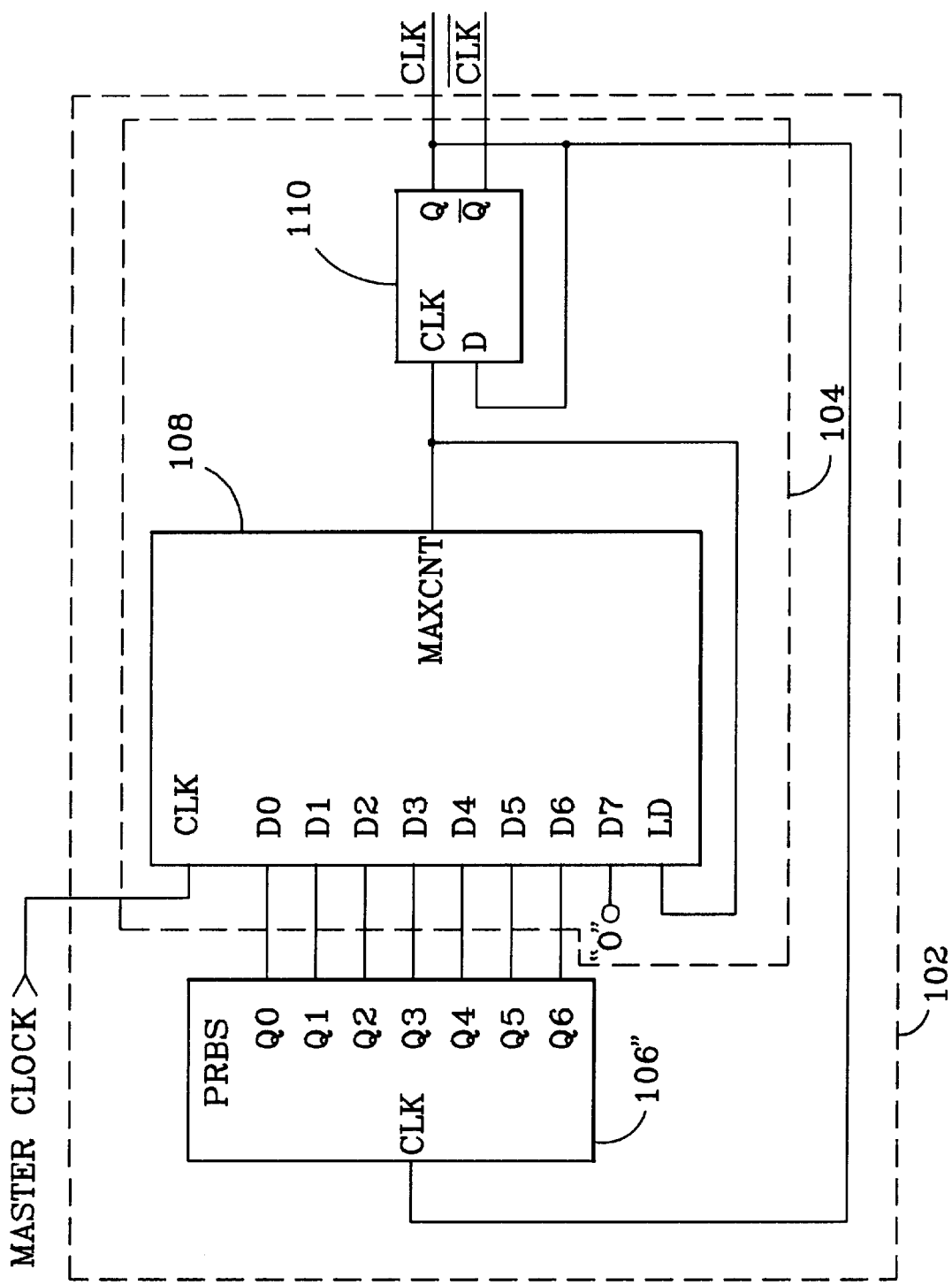
FIG. 4 is another embodiment of a chopping signal generating circuit per the present invention.

A loadable counter 104 is preferably used to dynamically vary CLK and $\overline{CLK}$. The loadable counter receives a master clock signal at a clock input, and a binary word at its load inputs. The counter has complementary outputs Q and $\overline{Q}$ which toggle when the counter reaches its maximum count; Q and $\overline{Q}$ can be used to generate CLK and $\overline{CLK}$ directly, as shown in FIG. 2, or can be further divided down to generate the clock signals, as shown in FIGS. 3 and 4 (described below). The time required by the loadable counter to reach the maximum count is determined by the frequency of the master clock signal and the binary word loaded into the load inputs. The binary word is periodically changed and loaded into counter 104 to vary the frequency of CLK and $\overline{CLK}$.

The upper and lower frequency limits $f_{cl}$ and $f_{ch}$ are established by limiting the binary word values presented to the load inputs. For example, maintaining the most significant bit of the load input at zero sets $f_{cl}=f_{ch}/2$. A load input generating circuit 106 is used to generate the binary word values that are loaded into the loadable counter 104 The CSA configuration shown in FIG. 2 is merely exemplary, and the invention is not limited to the particular CSA implementation shown. The dynamically varied frequency modulated chopping frequency produced per the present invention will provide benefits with any CSA that suffers from IMD and chopping noise induced by the operation of its switches.

As an example of the improvement in noise performance afforded by the invention, assume that the chopping frequency generating circuit is arranged to modulate chopping frequency $f_c$ between a lower limit $f_{cl}$ of 1.5 kHz and an upper limit $f_{ch}$ of 3 kHz. Modulating the chopping period with a uniform probability density to produce an $f_c$ that varies between these limits raises the noise floor by only about 1.59 dB with respect to clocking at $f_{ch}$. In contrast, a chopper-stabilized amplifier per the patent to Brown and arranged to modulate its chopping period with a PRBS to produce an $f_c$ that varies between upper and lower limits of 3 kHz and 23.6 Hz, respectively, raises the noise floor by about 6.88 dB with respect to clocking at the upper limit.

The dramatic improvement in IMD and noise performance realized with a chopper-stabilized amplifier as disclosed herein allows the amplifier to have both a wider input amplitude range as well as a wider input frequency range than would otherwise be possible. With most prior art designs, the IMD that arises from the chopping action becomes indistinguishable from the signal itself for input frequencies that are one-half of the chopping frequency or greater. This IMD places a practical frequency limit of about $f_c/2$ on input signals. However, varying the chopping frequency as described herein greatly reduces the IMD, thereby eliminating the $f_c/2$ constraint on input signals.

Two possible implementations of chopping frequency generating circuit 102 are shown in the schematic diagrams of FIGS. 3 and 4. Loadable counter 104 includes a counter 108 with a clock input CLK, a load control input LD, eight load inputs D0–D7, and an output MAXCNT which goes high when counter 108 reaches its maximum count. MAXCNT is connected to LD, so that the binary word presented at load inputs D0–D7 is loaded into counter 108 each time it reaches its maximum count. MAXCNT is also connected to the clock input of a division circuit 109, preferably a D-type flip-flop 110, which divides MAXCNT by two and provides the CSA's CLK and $\overline{CLK}$ outputs from its Q and $\overline{Q}$ outputs, respectively.

A master clock having a frequency $f_m$ is provided to the CLK input of counter 108, which divides it down by a factor determined by the value of the binary word loaded into its load inputs. For example, assume $n_{max}$ is the maximum count of counter 108 and N is the value of the binary word loaded into the counter via load inputs D0–D7. The counter output MAXCNT goes high whenever the output attains the value $n_{max}$, and produces a pulse every $(n_{max}-N+1)$ counts. Flip-flop 110 further divides this by two, resulting in an output frequency $f_c$ which is given by:

$$f_c = f_m/[2(n_{max}-N+1)],$$

which is the frequency of the CLK and $\overline{CLK}$ signals.

The load input generating circuit 106 generates the N value presented at load inputs D0–D7. The CLK signal is connected to the load input generating circuit; when CLK toggles, a new value of N is produced, which is loaded into counter 108 upon the next occurrence of MAXCNT. In this way, the frequency of CLK and $\overline{\text{CLK}}$ are dynamically changed and frequency modulation is achieved.

In FIG. 3, load input generating circuit 106 is implemented with a 7-bit counter 106'. The binary word N appears at the counter's outputs Q0–Q6, which are connected to load inputs D0–D6, respectively, of counter 108. The CLK signal causes counter 106' to repeatedly cycle from zero to $2^7$ and back to zero.

Because the LD input is clocked with MAXCNT while counter 106' is clocked by CLK, counter 108 loads the same N value twice before N is changed by CLK. This makes both the high and low edges of CLK have the same width, giving CLK and $\overline{\text{CLK}}$ 50% duty cycles. This clocking scheme is preferred, though not strictly necessary.

MAXCNT is divided by two in FIG. 3, but circuit 102 could also be arranged such that MAXCNT is divided by other integer multiples of two. If MAXCNT is divided by a value X which is an integer multiple of two, counter 108 loads the same N value X times. This also gives CLK and $\overline{\text{CLK}}$ 50% duty cycles, and is also a preferred clocking scheme.

The modulation range of $f_c$ can be controlled by limiting the range of N to less than $n_{max}$. For example, by setting the most significant load input bit D7 to "0" (as illustrated in FIG. 3), N varies from 0 to $(n_{max}-1)/2$, and the frequency of CLK can be modulated between approximately $f_m/(2n_{max})$ and $f_m/n_{max}$. This modulation range provides a good trade-off between low frequency noise and reduction of both chopping noise and IMD.

In FIG. 4, load input generating circuit 106 is implemented with a PRBS 106", which produces a binary word N on its eight output lines Q0–Q7. Outputs Q0–Q6 are connected to respective load inputs D0–D6, with D7 set to "0". The PRBS is clocked by the CLK signal to dynamically vary the chopping frequency $f_c$.

Upper and lower frequency limits $f_{cl}$ and $f_{ch}$ are inherently provided by the components shown in FIGS. 3 and 4, and some control over them can be provided by fixing one or more of load inputs D0–D7 to a "0" or "1" as needed. Additional flexibility can be provided by, for example, making counter 106' a loadable counter and manipulating the binary word at its load inputs as needed to produce a desired range of N values.

The load input generating circuits shown in FIGS. 3 and 4 are merely illustrative, with many other circuit implementations possible. A circuit which can produce and dynamically vary a chopping frequency between specific upper and lower frequencies, with the lower frequency limit being significantly above DC, will suffice.

While particular embodiments of the invention have been shown and described, numerous variations and alternate embodiments will occur to those skilled in the art. Accordingly, it is intended that the invention be limited only in terms of the appended claims.

I claim:

1. A chopper-stabilized amplifier (CSA), comprising:
   a main electrical signal amplifier,
   an auxiliary electrical signal amplifier connected in a chopper-stabilized circuit with said main amplifier to reduce the input voltage offset of said main amplifier, and
   a digital chopping frequency generating circuit arranged to generate a chopping frequency for said chopper-stabilized circuit that is dynamically varied between a non-zero minimum frequency limit $f_{cl}$ which is significantly above DC and a maximum frequency limit $f_{ch}$, frequency limit $f_{cl}$ being between 25% and 75% of frequency limit $f_{ch}$, said chopping frequency connected to operate said chopper-stabilized circuit, said chopping frequency generating circuit comprising:
   a loadable counter having a clock input for receiving a master clock signal, load inputs, a load control input and an output, and
   a load input generating circuit arranged to place a binary value on said loadable counter's load inputs such that, when said binary value is loaded into said loadable counter, said loadable counter divides a master clock signal at its clock input in accordance with said binary value and produces a divided master clock frequency at said loadable counter output to generate said chopping frequency to said CSA, said load input generating circuit arranged to periodically change said binary value and said loadable counter arranged to periodically load said changed binary value, thereby frequency modulating said chopping frequency,
   said dynamically varied chopping frequency reducing both chopping noise and intermodulation distortion between an input signal presented to said main amplifier and the chopping signal without significantly increasing low frequency input-referred noise.

2. The chopper-stabilized amplifier of claim 1, wherein said load input generating circuit comprises a second counter.

3. The chopper-stabilized amplifier of claim 1, wherein said load input generating circuit comprises a pseudo-random binary sequence (PRBS) generator.

4. The chopper-stabilized amplifier of claim 1, further comprising a division circuit connected to divide said loadable counter output by a value X which is an integer multiple of two to produce a divided output as the chopping frequency, said loadable counter output connected to load a binary value presented at said load inputs into said loadable counter, and said division. circuit connected to said load input generating circuit to change said binary value, said loadable counter loading the same binary value X times for each binary value change, thereby making said chopping frequency's duty cycle 50%.

5. The chopper-stabilized amplifier of claim 1, wherein said chopping frequency generating circuit restricts said loadable counter's load input range such that said lower chopping frequency limit is between 25% and 75% of said upper chopping frequency limit.

6. (amended) A chopper-stabilized amplifier (CSA), comprising:
   a main amplifier having inverting, non-inverting and null inputs and an output, said inverting and non-inverting inputs being said CSA's input terminals and said output being said CSA's output terminal, said main amplifier's output being a function of an input voltage applied across said input terminals and a voltage applied at said null input,
   an auxiliary amplifier having inverting, non-inverting and null inputs and an output,
   first and second switches arranged to connect said auxiliary amplifier's output to the null inputs of said main and auxiliary amplifier's, respectively,
   a third switch arranged to connect said auxiliary amplifier's non-inverting input to its inverting input,
   a fourth switch arranged to connect the non-inverting input of said auxiliary amplifier to the non-inverting input of said main amplifier, first and second capacitors connected to the null inputs of said main and auxiliary amplifiers, respectively, and a digital chopping frequency generating circuit arranged to generate at least one chopping signal having alternating states and a dynamically changing non-zero frequency, said generating circuit arranged to close said first and fourth switches and open said second and third switches during one chopping signal state, and to close said second and third switches and open said first and fourth switches during the other chopping signal state, said chopping frequency generating circuit arranged to dynamically vary the frequency of said at least one chopping signal between an upper limit $f_{ch}$ and a lower limit $f_{cl}$ to substantially reduce clock noise and intermodulation distortion between an input voltage applied across said input terminals and the chopping signal, said lower limit $f_{cl}$ being a non-zero frequency that is significantly greater than DC to reduce low-frequency input-referred noise, said chopping frequency generating circuit comprising a loadable counter having load inputs and an output and clocked with a master clock signal and which divides said master clock signal in accordance with a binary value placed on said load inputs and loaded into said loadable counter to produce said chopping signal at said loadable counter output, said chopping frequency generating circuit arranged to periodically load a periodically changing binary value into said loadable counter to dynamically vary the ratio between said master clock signal frequency and said chopping signal frequency and thereby modulate said chopping frequency between said upper and lower limit.

7. The chopper-stabilized amplifier of claim 6, wherein the upper limit $f_{ch}$ imposed by said chopping frequency generating circuit is low enough to accommodate the settling time of said first and second capacitors.

8. The chopper-stabilized amplifier of claim 6, wherein the lower limit $f_{cl}$ imposed by said chopping frequency generating circuit is between about 25% and 75% of said upper limit $f_{ch}$.

9. The chopper-stabilized amplifier of claim 6, wherein said chopping frequency generating circuit further comprises a load input generating circuit arranged to present said binary value to said load inputs, said chopping frequency generating circuit arranged to periodically vary the binary value produced by said load input generating circuit.

10. The chopper-stabilized amplifier of claim 14, wherein said chopping frequency generating circuit further comprises a division circuit connected to said loadable counter output to divide said loadable counter output by a value X which is an integer multiple of two and to produce said divided output as said chopping signal at an output, said loadable counter output connected to load said binary value presented at said load inputs into said loadable counter and said division circuit output connected to said load input generating circuit to change said binary value, said loadable counter loading the same binary value X times for each binary value change, thereby making said chopping frequency's duty cycle 50%.

11. The chopper-stabilized amplifier of claim 9, wherein said load input generating circuit comprises a counter.

12. The chopper-stabilized amplifier of claim 9, wherein said load input generating circuit comprising a pseudo-random binary sequence (PRBS) generator.

13. The chopper-stabilized amplifier of claim 9, wherein said chopping frequency generating circuit restricts said loadable counter's load input range such that said lower chopping frequency limit is between 25% and 75% of said upper chopping frequency limit.

14. A method of operating a chopper-stabilized amplifier (CSA) with reduced clock noise, intermodulation distortion and low-frequency noise, said CSA having switches operated to reduce the CSA's input voltage offset, comprising the steps of:

operating the switches of said CSA with a chopping signal, dynamically varying the frequency of said chopping signal between an upper frequency limit and a lower frequency limit to reduce clock noise and intermodulation distortion, said step of dynamically varying said chopping frequency comprising the steps of:

loading a binary value into a loadable counter, continuously clocking said loadable counter with a master clock operating at a master clock frequency to produce a chopping signal output which is divided down from said master clock according to the value of said loaded binary value, altering said binary value and loading said altered value into said loadable counter to change the ratio between said master clock and said output, and repeatedly altering and loading binary values to dynamically vary the ratio between said master clock frequency and said chopping signal output frequency and thereby frequency modulate said chopping signal, and establishing said lower frequency limit at a value significantly greater than zero to reduce low-frequency noise.

15. The method of claim 14, wherein said lower frequency limit is between about 25% and 75% of said upper frequency limit.

16. The method of claim 14, wherein said CSA includes a main amplifier and an auxiliary amplifier, each of said amplifiers has a respective null input connected to a respective capacitor, and said upper frequency limit is set low enough to accommodate the settling times of said main and auxiliary amplifier capacitors.

17. The method of claim 14, wherein said binary values are generated with a counter.

18. The method of claim 14, wherein said binary values are generated with a pseudo-random binary sequence (PRBS) generator.

19. The method of claim 14, wherein said loadable counter's load input range is restricted such that said lower chopping frequency limit is between 25% and 75% of said upper chopping frequency limit.

20. The method of claim 14, further comprising the step of dividing down said loadable counter output to further reduce the frequency of said CSA's chopping signal with respect to said master clock frequency.

21. The method of claim 14, further comprising the step of using said CSA to amplify an input signal having a frequency equal to or greater than one-half the chopping signal frequency with substantially no intermodulation distortion between said input and clock signals.

* * * * *